United States Patent [19]

Bechet et al.

[11] 4,114,336

[45] Sep. 19, 1978

[54] ELECTRICAL SWITCHBOARD FRAMEWORK

[75] Inventors: Henri L. J. Bechet, Hermalle, Argenteau; José J. A. Vertongen, Herstal, both of Belgium

[73] Assignee: Westinghouse Electric Corp., Pittsburgh, Pa.

[21] Appl. No.: 735,921

[22] Filed: Oct. 27, 1976

[30] Foreign Application Priority Data

Nov. 19, 1975 [BE] Belgium ................. 835699

[51] Int. Cl.² .................. H02B 1/02
[52] U.S. Cl. .................. 52/280; 52/648; 52/656; 312/257 SK; 361/335; 403/172
[58] Field of Search .......... 52/648, 280, 656; 403/172; 312/257 R, 257 SK; 361/335, 390

[56] References Cited

U.S. PATENT DOCUMENTS

| | | | |
|---|---|---|---|
| 1,462,617 | 7/1923 | Ohnstrand | 52/280 |
| 2,058,263 | 10/1936 | Rosendale | 52/280 X |
| 2,167,525 | 7/1939 | Rosendale | 403/172 |
| 3,085,664 | 4/1963 | Adams et al. | 52/280 |
| 3,110,535 | 11/1963 | Anderson | 312/257 SK |
| 3,265,419 | 8/1966 | Durnbaugh et al. | 312/257 SK |
| 3,353,854 | 11/1967 | Hansen | 52/656 |
| 3,919,603 | 11/1975 | Salvati et al. | 361/335 |

*Primary Examiner*—J. Karl Bell
*Attorney, Agent, or Firm*—Robert E. Converse, Jr.

[57] ABSTRACT

A framework for an electrical switchboard comprises four angled uprights, and top and bottom angled crossbars. The uprights and crossbars each have the same cross section and are formed of sheet metal folded into four parts. The first part is contiguous with and perpendicular to the second part having the same width as the first part. The third part is narrower than the first part and is contiguous with and perpendicular to the second part, and is also contiguous with and perpendicular to a fourth part. The first and third parts are located on the same side of the second part, while the second and fourth parts are located on opposite sides of the third part.

8 Claims, 3 Drawing Figures

ELECTRICAL SWITCHBOARD FRAMEWORK

BACKGROUND OF THE INVENTION

The present invention concerns a metal framework for an electrical switchboard consisting of upper and lower angled uprights and angled crossbars, each made with the same kind of cross section and preferably provided with rows of equidistant holes so that the framework can be assembled by means of screws or rivets. Metal frameworks of this type are well known but they display many drawbacks, especially the drawback that the crossbars and the uprights are not in the same plane, and that the rigidity of the corners where an upright and two crossbars meet is insufficient.

It is therefore desired to provide an improved switchboard framework which eliminates the above drawbacks and exhibits planar faces and superior rigidity.

SUMMARY OF THE INVENTION

In accordance with the principles of the present invention there is provided a metal electrical switchboard framework comprising a plurality of angled uprights, and top and bottom crossbars, the uprights and crossbars each having the same cross section. The cross section is formed by a strip of sheet metal bent into four parts, namely a first part which is contiguous with and perpendicular to a second part and of the same width as the first part, and a third part which is appreciably narrower than the first part and which is perpendicular to the second part and contiguous with and perpendicular to a fourth part, the first and third parts being located on the same side of the second part while the second and fourth parts are located on either side of the third part. Preferably, the front and rear faces of the framework are each defined by a frame made of the first parts of the cross sections, all of which are in the same plane, while the lateral faces are each defined by a framework made of the second parts of the sections, all in the same plane.

BRIEF DESCRIPTION OF THE DRAWINGS

The invention is explained below on the basis of a form of construction which is illustrated by the appended drawings in which.

DESCRIPTION OF THE PREFERRED EMBODIMENT

Figure 1:
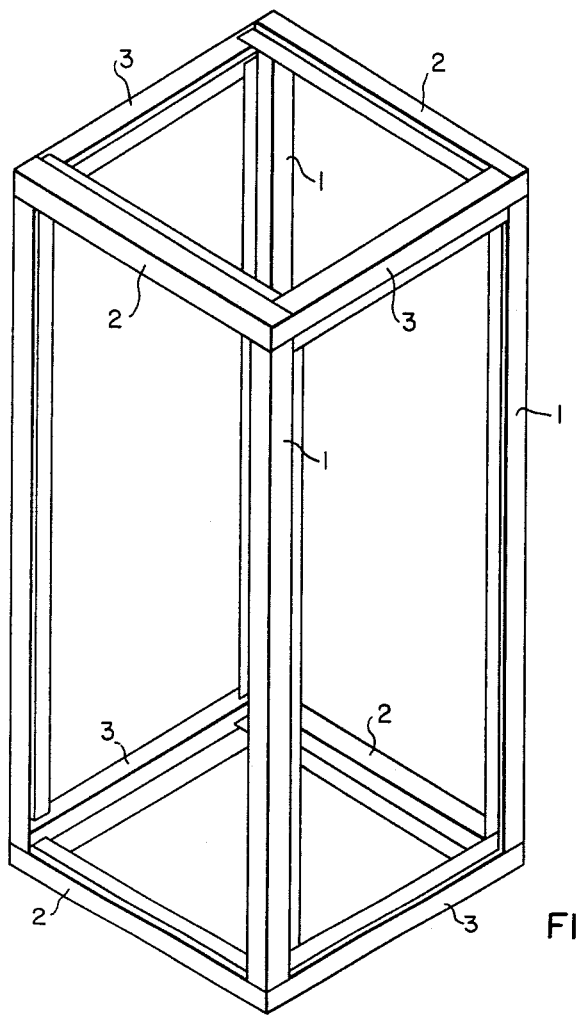
FIG. 1 shows a perspective view of a framework in accordance with the invention.
Figure 3:
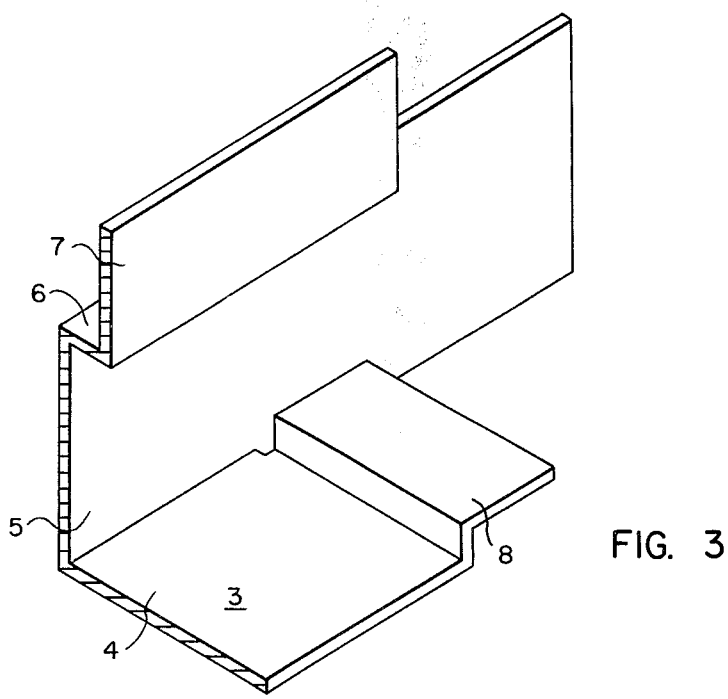
FIG. 3 shows a perspective view of one of the crossbars shown in FIG. 2.

Referring now to the drawings, in which like reference characters correspond to like members, FIG. 1 illustrates a metal framework in accordance with the invention. It consists of the uprights 1, the front and rear crossbars 2, and the lateral crossbars 3, all of which are made with the same cross section obtained by bending a sheet metal strip. As illustrated in FIG. 3, the cross section consists of four parts, namely a first part 4 which is contiguous with and perpendicular to a second part 5 having the same width as the first part 4, and a third part 6 which is appreciably narrower than the first part 4 and which is contiguous with and perpendicular to both the second part 5 and a fourth part 7. The first and third parts 4 and 6 are located on the same side of the second part 5. On the other hand, the second and fourth parts 5 and 7 are located on either side of the third part 6.

As shown in FIG. 1, the front and rear faces of the framework are defined by the first parts of uprights 1 and 2. The lateral faces of the framework are defined by the second parts of uprights 1 and crossbars 3. In addition, the lateral faces present a reinforced shoulder defined by the third and fourth parts of uprights 1 and crossbars 3.

Figure 2:
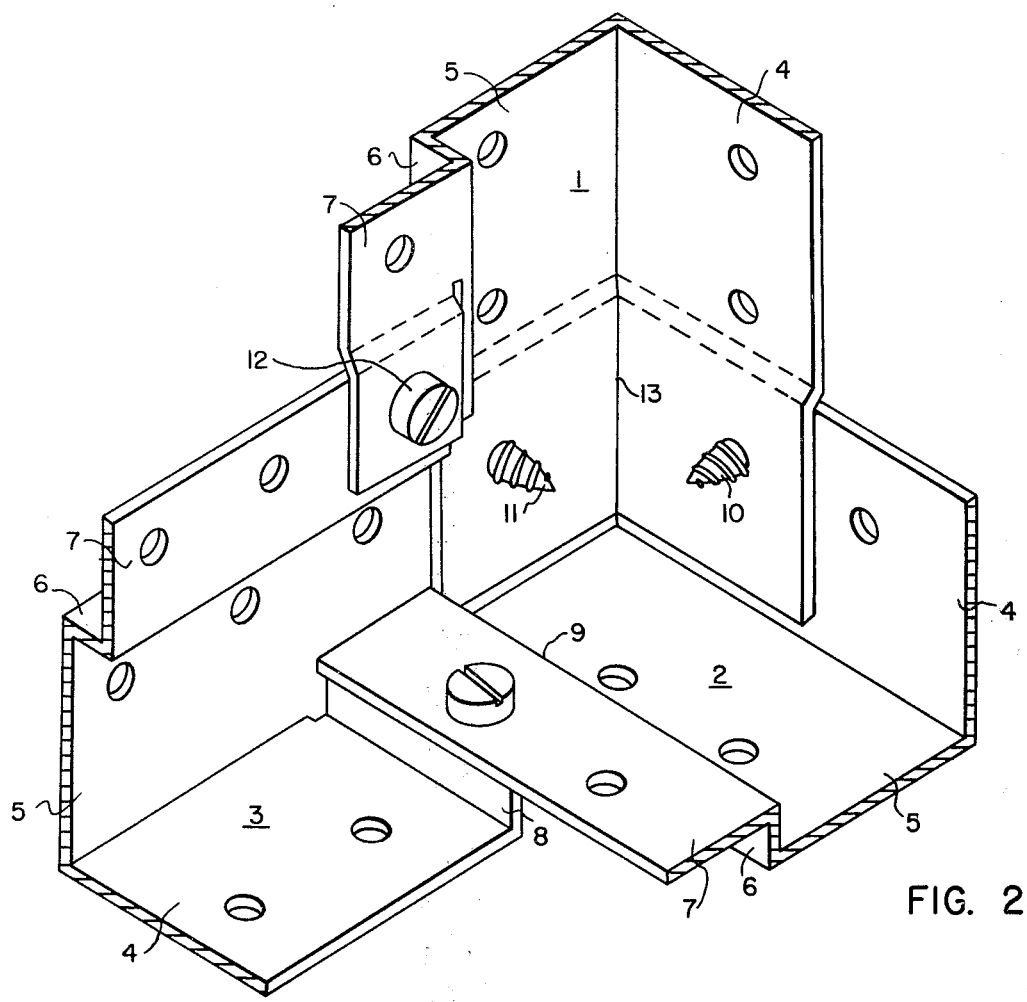
FIG. 2 shows a perspective view of a corner illustrated in FIG. 1, but on an enlarged scale.

Assembly of the framework is shown in detail in FIG. 2 which shows a corner of the framework illustrated in FIG. 1 and in which an upright 1, a crossbar 2, and a crossbar 3 meet. Crossbar 2 is provided with a straight end section which abuts against the second part 5 of crossbar 3. The end of crossbar 3 is cut off and its first part 4 is cut away and bent to form a small tongue 8 as shown in FIG. 3.

Tongue 8 of crossbar 3 is connected to the fourth part 7 of crossbar 2 by means of a fastener such as a screw 9. The end of upright 1 is cut and shaped as shown in FIG. 2. The ends of the first and second parts 4 and 5 of upright 1 are bent in by the thickness of the sheet metal in order to ensure that the respective first parts 4 of crossbar 2 and upright 1, which are fastened together by screw 10, lie in the same plane, and that the respective second parts 5 of crossbar 3 and upright 1, which are held together by screw 11, are likewise in the same plane. The third part 6 of upright 1 is cut back to allow it to pass above the second part 5 of crossbar 3 and be contiguous with the third part 6 of crossbar 3. The fourth part 7 of upright 1 is recut to the same length as its third part 6 and bent by the thickness of the sheet metal in order to ensure that the fourth part 7 of upright 1 and of crossbar 3, which are held together by screw 12, are located in the same plane and away from the plane of the second parts 5 by the width of the third parts 6. Because the width of the third parts 6 is appreciably less than the width of the first and second parts 4 and 5, it does not in any way impede the assembling of the first and second parts. Thanks to the fact that the width of the first part is equal to that of the second part, it is possible to make a first part 4 of a crossbar 2 converge into a single sharp edge 13 with a second part 5 of a crossbar 3 without encountering any difficulties of a technical nature or prejudicing the esthetic appearance.

The framework thus described has many advantages. Thanks to the fact that the sections are held together at the corners by means of four screws, and that the folds are made by bending the ends, the framework displays a high degree of rigidity comparable to that obtained by welding. Clearly, it is possible to use rivets or other types of fasteners instead of screws. It is possible to screw additional crossbars or uprights to the fourth parts of the crossbars on the bottom, top, and lateral faces without the lengths of the screws which pass through reaching the bottom. It is also possible to fix a top sheet (not shown) to the first and second parts of the top crossbars, or to fix a lateral sheet (not shown) to the second parts of the uprights and lateral crossbars. It is also possible, for example, to juxtapose and screw together several metal frames of the type shown in FIG. 1, by means of screws 11 located in the corner, as shown in FIG. 2. Furthermore, in the event that heavy apparatus or bulky cables have to be installed in the screw-assembled framework, it is easy, during the operation, to remove one of the top or bottom crossbars and then introduce the apparatus or the cables on rollers or by means of a crane hook, after which the crossbar is replaced. If operations of this type are not envisaged, or if rigidity tests show it to be absolutely necessary, the screwed joints, or some of these joints, may clearly be reinforced or replaced by welds.

We claim:

1. A metal electrical switchgear framework comprising structural members including angled uprights and top and bottom angled crossbars, said structural members having the same cross section, the cross section of said structural members being formed of a strip of sheet metal folded into four parts, the first part being contiguous with and perpendicular to the second part having the same width as said first part, and the third part being appreciably narrower than said first part and which is contiguous with and perpendicular to said second part, said third part being also contiguous with and perpendicular to the fourth part, said first and third parts being located on the same side of said second part while said second and fourth parts are located on opposite sides of said third part.

2. A metal framework as recited in claim 1 wherein two opposite faces of the framework are each defined by a frame comprising said first parts of the cross sections, all of said frame first parts being in the same plane, and wherein the other two opposite faces of the framework are each defined by a frame made of said second parts of the cross sections, all of said frame second parts being in the same plane.

3. A metal framework as recited in claim 2 wherein in each corner of the frame, the end of a first one of said structural members is cut straight across; the end of a second one of said structural members is cut back along said first, third, and fourth parts, and a portion of said first part is folded back and offset an amount approximately equal to the width of said third part so as to mate with the fourth part of said first one of said structural members; while the end of a third one of said structural members has its first and second parts bent back by the thickness of the sheet metal; the third part cut back; and the fourth part cut, folded, and bent back by the thickness of the sheet metal.

4. A metal framework as recited in claim 1 wherein in each corner of the frame, the end of a first one of said structural members is cut straight across; the end of a second one of said structural members is cut back along said first, third, and fourth parts; and a portion of said first part is folded back and offset an amount approximately equal to the width of said third part so as to mate with the fourth part of said first one of said structural members; while the end of a third one of said structural members has its first and second parts bent back by the thickness of the sheet metal; the third part cut back; and the fourth part cut, folded, and bent back by the thickness of the sheet metal.

5. A metal framework as recited in claim 4 wherein a plurality of joining locations are formed comprising overlapping surfaces formed by a first part of a first structural member and a first part of a second structural member, a second part of said second structural member and a second part of a third structural member, a fourth part of said second structural member and a fourth part of said third structural member, and a fourth part of said first structural member and a fourth part of said third structural member.

6. A metal framework as recited in claim 5 comprising a plurality of fasteners, one fastener passing through both overlapping surfaces of each joining location.

7. A metal framework as recited in claim 6 wherein said fasteners comprise sheet metal screws.

8. A metal framework as recited in claim 5 wherein the overlapping surfaces of each joining location are welded together.

* * * * *